United States Patent [19]

Hall et al.

[11] Patent Number: 5,187,389
[45] Date of Patent: Feb. 16, 1993

[54] NOISE RESISTANT LOW VOLTAGE BROWNOUT DETECTOR WITH SHUT OFF OPTION

[75] Inventors: Christopher M. Hall, Redwood City; Kenneth E. Dubowski, Sunnyvale, both of Calif.

[73] Assignee: National Semiconductor Corporation, Santa Clara, Calif.

[21] Appl. No.: 695,487

[22] Filed: May 3, 1991

[51] Int. Cl.$^5$ .................. H03K 5/153; H03K 17/00
[52] U.S. Cl. .................. 307/350; 307/296.1; 307/272.3; 307/354; 307/363
[58] Field of Search .............. 307/350, 354, 362, 363, 307/272.3, 296.1, 296.3, 296.5, 296.8

[56] References Cited

U.S. PATENT DOCUMENTS

| | | | |
|---|---|---|---|
| 4,888,498 | 12/1989 | Kadakia | 307/272.3 |
| 4,902,910 | 2/1990 | Hsieh | 307/350 |
| 4,948,995 | 8/1990 | Takahashi | 307/350 |
| 4,983,857 | 1/1991 | Steele | 307/362 |
| 5,027,006 | 6/1991 | Queinnec et al. | 307/272.3 |

FOREIGN PATENT DOCUMENTS 2549317  1/1985  France ...................... 307/272.3

Primary Examiner—John Zazworsky
Attorney, Agent, or Firm—Gail W. Woodward; Irving S. Rappaport; James W. Roe

[57] ABSTRACT

An integrated circuit which will produce a switched output when the circuit power supply drops a predetermined level below which reliable IC operation is not assured. This reduced power supply condition is referred to as brownout wherein the switching is related to the active devices. A preferred CMOS circuit is disclosed. The switching level is related to the N channel and P channel transistor sum of thresholds which makes the CMOS circuit process adaptive. The circuit is provided with a transistor gate oxide capacitor for improving noise immunity while achieving maximum utilization of IC chip area. In addition, output enable and circuit shutdown capabilities are detailed.

3 Claims, 1 Drawing Sheet

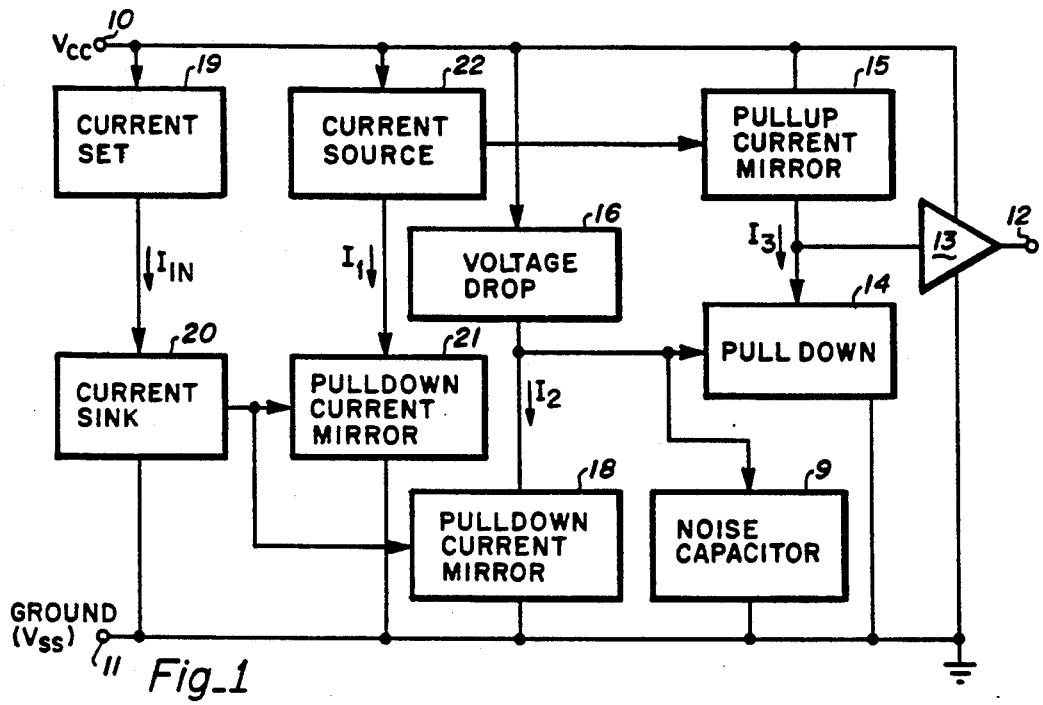
Fig_1
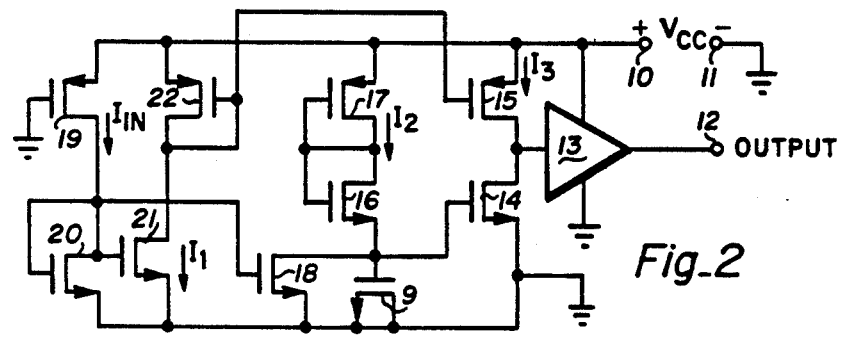
Fig_2
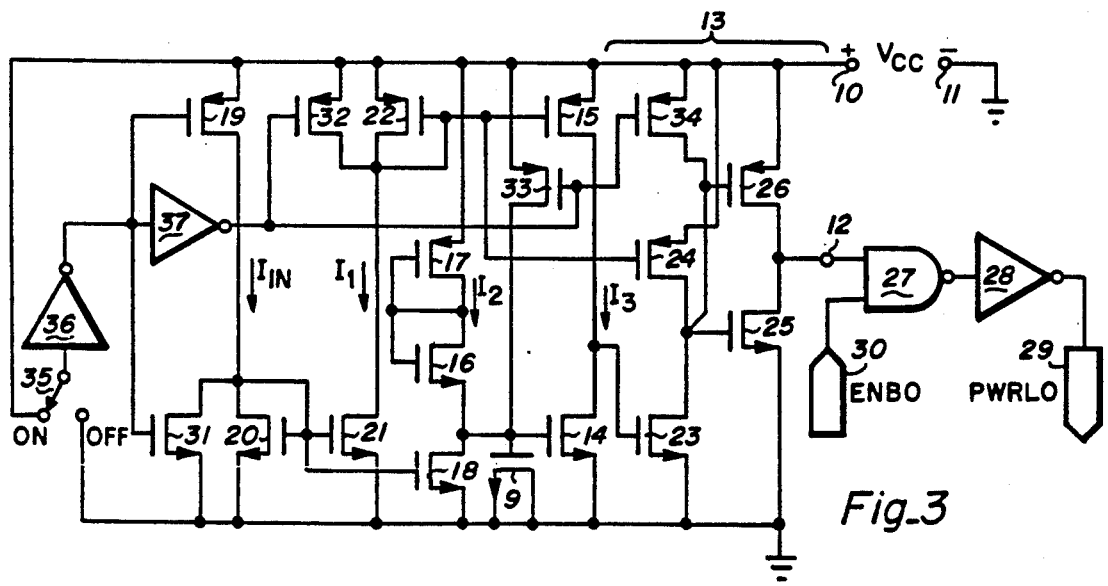
Fig_3

NOISE RESISTANT LOW VOLTAGE BROWNOUT DETECTOR WITH SHUT OFF OPTION

BACKGROUND OF THE INVENTION

The invention relates to a circuit that, while useful in other devices, is useful primarily in complementary metal oxide semiconductor (CMOS) circuits. Since CMOS circuits are commonly employed in battery powered equipment it is desirable that a battery condition monitor be incorporated to indicate when the battery voltage has dropped below a particular level which indicates that replacement or recharging is in order. Also, when an A-C line rectified power supply is employed, its output can decline due to the loss of one or a few cycles of excitation. The lowered supply voltage state is commonly called brownout because the next stage, or blackout, will occur when the voltage has fallen to a point where the circuits will not operate. Typically, a switching circuit is employed and its switching level set to sense a brownout level prior to the blackout level. Most of the prior art battery condition indicators show when an arbitrary voltage level is reached and this level is chosen to be sufficiently above the blackout level that when all manufacturing tolerances are considered the circuit performance is reliable in all cases. This results in a relatively high switching level. It would be more desirable to set the switching level lower and in response to the circuit function itself. If the switching level is set to be just a small increment over that level at which the circuits function, manufacturing tolerances will have no effect and a true brownout level is indicated. This would be equivalent to an adaptive reference level keyed to circuit performance rather than an arbitrary value.

Another consideration relates to fluctuations in battery or supply voltage which manifest themselves as noise on the supply lines. Such noise can result from the operation of associated circuitry or the switching on and off of other devices connected to the same supply. It is desirable that the brownout detector be as immune to such noise as possible and yet be able to respond when a true dropout has occurred.

Since the devices described here may relate to battery operation, it is also desirable that current consumption be minimized To this end, it is desirable that the brownout detector itself be operated at the lowest possible current. Accordingly a shut-off feature is desirable wherein the detector can be turned off or reduced to a state of insignificant current consumption when it is known that no indication is needed. This would be the case, for example, just after battery replacement or recharging. Here it is known that the equipment will operate normally for at least a known period of time. Or, a mask option may be used to manufacture a chip with the brownout detector permanently disabled or enabled, at the customer's choice.

U.S. Pat. No. 4,701,639, issued Oct. 20, 1987, to Silvo Stanojevic, and is assigned to the assignee of the present invention. It discloses a threshold detector circuit that is designed to monitor a power supply voltage and produce an output signal when the voltage drops below the threshold. In this circuit, bipolar elements are employed and a well-known bandgap temperature compensated voltage reference provides the desired threshold. Hysteresis is added to the bandgap circuit to improve noise immunity.

Matsuura patent 4,024,415, issued on May 17, 1977, and discloses a CMOS battery voltage detecting circuit. The threshold voltages of a complementary pair of transistors provide the critical value of a voltage detector. However, the circuit shown suffers from the fact that there is no way that current can flow through the complementary pair in the FIG. 2 embodiment, and erratic performance would result. In the FIG. 3 embodiment, resistivity operated field effect transistors (FETs) are employed to force separate and independent currents through the complementary pair elements.

The teaching in the above two patents is incorporated herein by reference.

SUMMARY OF THE INVENTION

It is an object of the invention to create a stable power supply brownout detector.

It is a further object of the invention to produce a CMOS power supply brownout detector circuit, based upon the sum of P and N channel transistor thresholds, that has improved noise immunity.

It is a still further object of the invention to provide a CMOS power supply brownout detector circuit with a current shutoff feature that can be invoked to reduce power supply current drain when the brownout condition is not imminent or when the circuit function is not needed by a customer.

These and other objects are achieved in a circuit configured as follows. In the CMOS preferred embodiment an output buffer is driven from an inverter transistor which has its gate operated at a potential that is the sum of N and P channel transistor thresholds below the supply potential. Thus, when the supply is normal the gate of the inverter transistor is high and its drain is low, which is the normal circuit indication. This condition is repeated by the output buffer. When the power supply potential goes into brownout there will be a level at which the sum of thresholds will not be sustained and the gate of the inverter falls below its conduction threshold. Thus, the drain will go high so as to signal the brownout condition. The circuit includes a transistor that develops an operating current which is mirrored in the sum of thresholds holds circuit and into a transistor that operates the inverter transistor. A capacitor created from the gate of a transistor is connected across the inverter input thereby to reduce ther sensitivity to noise present upon the power supply line. Other circuit elements permit the brownout indication to be under an ENABLE command and the entire circuit can be switched off when the brownout detection capability is not desired.

BRIEF DESCRIPTION OF THE DRAWING

FIG. 1 is a block diagram showing the functional elements of the circuit of the invention.

FIG. 2 is a simplified schematic-block diagram of the circuit of the invention.

FIG. 3 is a more detailed schematic-block diagram of the circuit of the invention.

DESCRIPTION OF THE INVENTION

With reference to FIG. 1, a $V_{CC}$ power supply is connected + to terminal 10 and - to ground (or $V_{SS}$) terminal 11. The circuit has an output terminal 12 which is normally low when the power supply is at full voltage. The function of the circuit is to provide an output indication in response to the power supply brownout voltage level. In the case of a battery power source, the circuit is to provide an output indication when the battery must be replaced or recharged. Also, when an A-C line rectified power supply is employed, its output can decline due to the loss of one or a few cycles of excitation. The actual level in the power supply voltage decline, or brownout, is desirably based upon the lowest voltage that will still provide normal circuit functioning. In CMOS this will typically be at the complementary transistor sum of thresholds. Actually, the level will be at some increment above the sum of threshold values so that nearly optimum CMOS gate potentials are supplied with an additional increment for providing switching headroom. In actual operation, the lowest level at which the circuit provides a brownout output is close to one threshold above the sum of P and N transistor thresholds.

Buffer 13, which supplies the signal at output terminal 12, is driven by pull down element 14 so that a substantially rail-to-rail output is available. A pull up element 15 is also coupled to the input of buffer 13 and when operating supplies a current $I_3$ to pull down element 14. A noise reduction capacitor 9 is connected across the input to pull down element 14. A voltage dropping element 16 is coupled between the positive supply rail and the input to pull down element 14. In normal operation it conducts $I_2$ which activates the pull down which holds the input to buffer 13 low. $I_2$ normally flows in current mirror pull down element 18 which acts to cause $I_2$ to flow in element 16. Element 18 responds as a current mirror to current sink 20, which receives $I_{IN}$ from current set 21. Thus, $I_2$ is related to $I_{IN}$. Current sink 20 also operates pull down current mirror 21 which pulls current $I_1$ out of current source 22. Pull up current mirror 15, which supplies $I_3$, is in turn operated from current source 22. Thus, $I_3$ is also related to $I_{IN}$. As long as $I_2$ flows output terminal 12 will be held low and normal circuit operation proceeds.

When $V_{CC}$ declines, for example, the power supply battery voltage declines or the A-C power supply voltage drops, a point will be reached where the voltage drop across element 16 cannot be sustained and $I_2$ will drop. This will allow the conduction in pull down current mirror 18 to dominate and pull the input to pull down 14 low. This will overcome the pull down function and allow pull up current mirror 15 to pull the input to buffer 13 high, thus, signaling a power supply brownout. It can be seen that the brownout level indiction is determined in large measure by voltage drop element 16.

The elements described in FIG. 1 are described in block diagram form that can be implemented using almost any form of IC construction. However, the preferred embodiment is in CMOS form. FIG. 2 is a simplified schematic diagram showing the preferred circuit.

Buffer 13, which provides the output signal at terminal 12, is driven by N channel inverter transistor 14 to provide a substantially rail-to-rail output signal. The signal at the drain of transistor 14 switches from low to high as the supply voltage of the source declines through brownout. P channel transistor 15 serves as the load element for N channel inverter transistor 14.

N channel transistor 16, in combination with P channel transistor 17, provides the circuit voltage reference that determines the circuit switching level. Both of transistors 16 and 17 have their gates returned to their drains and they are connected in series. In normal circuit operation N channel transistor 18 will sink a small controlled current, $I_2$, through transistors 16 and 17 which will conduct and attempt to maintain a conduction threshold voltage drop across them. Thus, transistors 16 and 17 will attempt to maintain the gate of transistor 14 at the sum of N and P channel transistor thresholds, $V_{TPN}$, below the supply rail potential. As long as $V_{CC} - V_{TPN}$ is in excess of the threshold hold of transistor 14, the potential at the drain of transistor 14 will be low and the logic output at terminal 12 will be zero.

The small controlled current, $I_2$, is produced as follows. P channel transistor 19 is constructed as a narrow, long-channel channel device that displays substantial "on" resistance. The source of transistor 19 is returned to $+V_{CC}$ and its gate is grounded so that it is conductive. $I_{IN}$ will flow in N channel transistor 20, which has its gate and drain connected to the drain of transistor 19 and its source returned to ground. N channel transistor 18 is connected as a current mirror to transistor 20. If transistors 18 and 20 are matched, $I_2$ will equal $I_{IN}$.

N channel transistor 21 is also connected as a current mirror to transistor 20 and thereby conducts $I_1$. Since $I_1$ flows in P channel transistor 22, which has its gate and drain commonly connected to the drain of transistor 21 and its source returned to $+V_{CC}$, it too will conduct $I_1$. P channel transistor 15, which is the load for transistor 14, is connected as a current mirror to transistor 22. Then, assuming that transistors 22 and 15 are matched, $I_{IN}$ will attempt to flow in transistor 15. When transistor 15 dominates the drain of transistor 14 will be pulled high and when conduction in transistor 14 dominates its drain will be pulled low.

When $I_2$ exceeds $I_{IN}$, as would be the case when $V_{CC}$ exceeds the switching threshold, the gate of transistor 14 will rise so that it dominates and pulls its drain low. Furthermore, to ensure that the circuit is stable, transistor 14 is made stronger than transistor 15. Accordingly, assuming that $I_{IN} = I_1 = I_2 = I_3$, the circuit trip point is exceeded and transistor 14 will dominate to keep its drain low.

Buffer 13 will then pull terminal 12 low so as to indicate an adequate supply voltage or an absence of brownout.

It can be seen that VTPN is the critical switching element. A sufficient reduction in current must occur in transistors 16 and 17 in order to overcome the built-in circuit threshold so that terminal 12 is forced high.

As a practical matter, the signal at terminal 12 can act as a flag to signal power supply brownout. If desired, terminal 12 can be connected to other circuits, not shown, to automatically shut down critical elements that could react adversely in the presence of brownout.

Transistor 9 has its gate connected to the gate of transistor 14 and functions to provide a capacitance that bypasses the inverter switching signal produced by transistors 16 and 17. This capacitance will shunt high frequency noise and thereby reduce the sensitivity of the circuit to noise or rapid fluctuations of the $V_{CC}$ level. As a practical matter, any form of capacitor could be employed for this function. However, in the interest of avoiding off chip IC components an on-chip approach was chosen. While any form of on-chip capacitor, such as two metal plates, poly-metal plates, poly-to-poly plates or conventional MOS plates, could be used, a MOS transistor gate capacitance was employed because it provides the highest value of capacitance per unit area. An N channel transistor structure was chosen to form capacitor 9. Both the source and drain of transistor 9 are connected to ground and the gate is connected to the gate of transistor 14 so that transistor 9 will be turned on when transistor 14 is turned on. This is the normal circuit state so that a channel is normally present in transistor 9. This ensures a reliable gate capacitance wherein the induced channel serves as the other capacitor plate. The very thin gate oxide ensures a suitable capacitor value. In the preferred embodiment of the invention transistor 9 has an area of only 225 square microns so that a relatively small IC chip area is required.

FIG. 3 is a block-schematic diagram showing additional circuit details. Where similar circuit elements are present the same numerals are applied. Normally, and in brown-out, the circuits of FIGS. 2 and 3 operate identically. However, the details of buffer 13 are set forth and an output disable circuit incorporated. Also, means for shutdown of the brownout detection circuit are added. In the shutdown mode the circuit draws only diode leakage current, thus, conserving battery power.

N channel transistor 25 and P channel transistor 26 form the output stage of buffer 13 and operate as a conventional CMOS inverter gate to drive terminal 12. This inverter is in turn driven by N channel inverter transistor 23. P channel transistor 24 serves as the load for transistor 23. It can be seen that the two cascaded inverter stages allow transistors 23-26 to function as a high gain buffer that has a rail-to-rail output capability.

Terminal 12 drives a NAND gate 27 which in turn drives inverter 28 so that the circuit output, present at PWRLO pin 29 is a repetition of the signal at terminal 12. The second input of NAND gate 27 is an enable signal that is applied by way of ENBO pin 30. When pin 30 is high NAND gate 27 and inverter 28 function as a noninverting buffer and the signals at terminal 12 are repeated at pin 29. However, if pin 30 is low the output at pin 29 is disabled. This disable feature is useful in circuit applications where software control is employed.

Transistors 31 through 34 have been incorporated into the circuit to perform the shutdown function and they are operated by switch 35 and inverters 36 and 37. Whereas, the gate of transistor 19 was shown grounded in FIG. 1, in the FIG. 2 configuration the gate of transistor 19 can be operated by switch 35 and inverter 36. Switch 35 can be implemented in the form of a single pole double throw physical element. Alternatively, it can be implemented in the form of a CMOS device under the control of software. Alternatively, it can be operated by means of an IC metallization, diffusion or other circuit option.

When operated as shown in the ON position switch 35 will return the input of inverter 36 to the $+V_{CC}$ rail so as to force it high. This will result in a logic low at the gate of transistor 19, which is thereby turned on to function as described in connection with FIG. 1. When switch 35 is in its OFF position the input to inverter 36 is low and the gate of transistor 19 returned to $+V_{CC}$. In this state transistor 19 if off and $I_{IN}$ goes to zero. It, therefore, reduced $I_1$ and $I_3$ to zero. In the off state it can be seen that the gate of N channel transistor 31 is high so as to turn it on. This results in pulling the gates of transistor 18 and 21 low so that they cannot conduct. This reduces $I_2$ (and $I_1$ and $I_{IN}$) to zero.

In the OFF state of switch 35, it can be seen that the input to inverter 37 is high so that its output is low. This will turn on P channel transistors 32-34. Transistor 32 will pull the gate of transistors 15, 22 and 24 high so as to turn them off. Thus, $I_3$, $I_1$ and the drain current in transistor 23 all go to zero. Transistor 33 will pull the gate of transistor 14 high so it will clamp the gate of transistor 23 low to ensure that it is off. Transistor 34 will pull the gates of transistors 25 and 26 high so as to turn transistor 26 off and transistor 25 on. This will reduce the output stage current to zero and clamp terminal 12 low. The overall result is the cessation of any current flow in the circuit. Since gates 27, 28, 36 and 37 all employ CMOS gates that are not switched, they too will not draw any appreciable current.

EXAMPLE

The circuit of FIG. 2 was constructed using conventional CMOS elements. The following device sizes were employed:

| COMPONENT | W/L (MICRONS) |
| --- | --- |
| 9 | 15/15 |
| 16 | 25/5 |
| 17 | 60/5 |
| 19 | 5/100 |
| 20, 21, 18, 14, 23 | 10/10 |
| 25 | 30/3 |
| 26 | 40/3 |
| 31, 32, 33, 34 | 3/3 |

The circuit operated over a $V_{CC}$ range up to about 6 volts. The brownout trip level was observed to be 3.1 volts in the test vehicle. Clearly, this level was self-adjusting to the threshold values of the transistors being produced in the CMOS process. A typical $V_{TPN}$ value was found to be about 2 volts.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A CMOS brownout detector circuit connectable to a power supply having positive and negative rails wherein an output indication is provided when said power supply voltage drops below a predetermined brownout level, said circuit comprising:
   a first N channel transistor having a gate, a source connected to said negative rail and a drain at which said output indication will appear;
   a first P channel transistor having a gate, a source connected to said positive rail and a drain connected to said drain of said first N channel transistor;
   a second N channel transistor having its gate connected to its drain;
   a second P channel transistor having its gate connected to its drain and connected in series with said second N channel transistor with the series combination connected between said gate of said first N channel transistor and said positive rail;
   a third N channel transistor having a gate, a source connected to said negative rail and a drain connected to said gate of said first N channel transistor;
   a third P channel transistor having a source connected to said positive rail, a drain connected to said gate of said first P channel transistor and a gate connected to its drain;
   a fourth N channel transistor having a gate and having its source returned to said negative rail and its drain connected to said drain of said third P channel transistor;

a fifth N channel transistor having a source connected to said negative rail and a gate and drain coupled together to the gates of said third and fourth N channel transistors thereby to comprise a pair of current mirrors therewith;

a fourth P channel transistor having a source connected to said positive rail, a drain coupled to said drain of said fifth N channel transistor and a gate connected to a source of bias potential that will turn said fourth P channel transistor on whereby said current flow is passed by said second N channel and said second P channel transistors when said power supply exceeds said brownout level and whereby said third N channel transistor will pull the gate of said first N channel transistor low when said power supply drops below said brownout level; and a capacitor connected to said gate of said first N channel transistor whereby said circuit displays increased noise immunity.

2. The brownout detector of claim 1 wherein said drain of said first N channel transistor is coupled to drive a noninverting buffer which provides said circuit output signal and which produces a rail-to-rail switching response.

3. The brownout detector circuit of claim 2 wherein said predetermined brownout level output indication occurs when the conduction in said second P channel and N channel transistors fall below the conduction in said third N channel transistor.

* * * * *